(12) United States Patent
Lee et al.

(10) Patent No.: US 7,261,937 B2
(45) Date of Patent: Aug. 28, 2007

(54) FLUOROPOLYMER LAMINATES AND A PROCESS FOR MANUFACTURE THEREOF

(75) Inventors: Jeong Chang Lee, Shimizu (JP); Shosaku Kondo, Shimizu (JP)

(73) Assignee: Dupont-mitsui Fluorochemicals Co. Ltd., Tokyo (JP)

( * ) Notice: Subject to any disclaimer, the term of this patent is extended or adjusted under 35 U.S.C. 154(b) by 0 days.

(21) Appl. No.: 11/434,999

(22) Filed: May 15, 2006

(65) Prior Publication Data

US 2006/0204748 A1    Sep. 14, 2006

Related U.S. Application Data

(63) Continuation of application No. 10/271,849, filed on Oct. 16, 2002, now abandoned.

(30) Foreign Application Priority Data

Oct. 24, 2001 (JP) .............................. 2001-326794

(51) Int. Cl.
  B32B 27/04 (2006.01)
  B32B 27/08 (2006.01)
  B32B 27/18 (2006.01)
(52) U.S. Cl. ............... 428/300.7; 428/339; 428/421; 428/473.5
(58) Field of Classification Search ............ 428/297.4, 428/299.7, 300.7, 421, 422, 457, 339, 473.5; 442/119, 201, 311, 361, 363
See application file for complete search history.

(56) References Cited

U.S. PATENT DOCUMENTS

| 4,634,631 A | * | 1/1987 | Gazit et al. ................. 428/421 |
| 4,680,220 A | | 7/1987 | Johnson |
| 4,863,808 A | * | 9/1989 | Sallo ........................... 428/601 |
| 4,886,699 A | | 12/1989 | Carroll et al. |
| 4,943,473 A | * | 7/1990 | Sahatjian et al. ........... 442/289 |
| 5,275,877 A | * | 1/1994 | Isayev ..................... 428/299.7 |
| 5,919,878 A | | 7/1999 | Brothers et al. |
| 6,166,138 A | | 12/2000 | Kolouch |
| 6,433,093 B2 | | 8/2002 | Lee et al. |
| 2001/0006727 A1 | | 7/2001 | Lee et al. |

FOREIGN PATENT DOCUMENTS

| EP | 0 901 900 A1 | 3/1999 |
| EP | 1086987 A1 | 3/2001 |
| JP | 10-34742 | 2/1998 |
| JP | 31 39515 | 3/2001 |
| JP | 2001-171038 | 6/2001 |

* cited by examiner

Primary Examiner—Ramsey Zacharia

(57) ABSTRACT

The present invention provides fluoropolymer laminates having isotropic properties. For example, an embodiment in which multiple fluoropolymer sheets having an liquid crystalline polymer oriented in the fibrous state in the melt processible fluoropolymer are laminated, despite having the fibrous LCP oriented in one direction in each single extruded sheet, makes it possible to laminate in such a way as to compensate for their orientation directions, the laminate thereby becoming isotropic as regards physical properties. The laminates also have low linear coefficient of expansion and low thermal shrinkage as well as elevated tensile modulus and low-dielectric constant.

11 Claims, 1 Drawing Sheet

FLUOROPOLYMER LAMINATES AND A PROCESS FOR MANUFACTURE THEREOF

CROSS REFERENCE

This is a continuation of U.S. application Ser. No. 10/271,849, filed Oct. 16, 2002, now abandoned. U.S. application Ser. No. 10/271,849, filed Oct. 10, 2002 is a Non-Provisional of JP application number 2001-326794, filed Oct. 24, 2001, now pending.

FIELD OF THE INVENTION

This invention is in the field of fluoropolymer laminates.

BACKGROUND OF THE INVENTION

With trends toward miniaturization of devices, higher performance, and greater circuit density in electrical and electronic parts fields, there is a need for materials with excellent heat resistance, dimensional stability, low moisture absorption, and low dissipation at high frequencies, which is associated with dielectric constant. In particular, as advancements are made in information technology, circuit boards increasingly need to have good performance high frequency.

Circuit boards are commonly made from copper cladding on such reinforcing substrates as follows: glass cloth impregnated with epoxy resin, fluoropolymer film, substrates obtained by impregnation of glass cloth with a liquid in which a polytetrafluoroethylene (PTFE) particles are dispersed as disclosed in Japanese Patent Application Publication Kokai 2001-171038, and laminates obtained by laminating polyphenylene sulfide (PPS) film to a fibrous product mainly comprised of PTFE as disclosed in Japanese Patent No. 3139515.

However, these films and laminates are deficient in the following aspects: Copper-clad laminates obtained by impregnation of glass cloth with an epoxy resin are inferior in high frequency characteristics and moisture absorption characteristics, and they often warp, which is attributable to the differences in the coefficient of thermal expansion of the substrate and the copper foil. Furthermore, they sometimes suffer from an inability to accept plating (copper cladding) when the glass is exposed in the through holes. Through-holes are holes made though the circuit board, the inside of the holes being metal-plated to provide an electrically conductive connection between layers in the board. Copper-clad fluoropolymer laminates also tend to suffer from thermal stress due to the differences in the coefficients of thermal expansion of the copper foil and the fluoropolymer substrate, resulting in problems such as the delamination of the copper foil. Fluorinated film substrates are not easily adhered to: they have difficulty accepting paste and plating during the printing for a circuit formation, lamination of metal foils, or through-hole fabrication. Laminates from PTFE fibrous product and PPS film, while showing low thermal shrinkage, are inferior in high frequency characteristics due to the use of the PPS film, which has a dielectric constant higher than that of the fluoropolymer.

Liquid crystalline polymers (LCP) would be expected to find applications in electronic parts areas because of their high strength, high heat resistance, low coefficient of thermal expansion, and good insulation characteristics. It has been disclosed that blending a melt processible fluoropolymer with an LCP and causing the LCP to be in a fibrous state in the melt processible fluoropolymer matrix can improve the tensile modulus of the melt processible fluoropolymer and its coefficient of linear expansion (EP 1 086 987 A1). It has also been disclosed that introduction of a fluoropolymer having a specific functional group (hereafter called a compatibilizing agent) brings about uniformity in the size of the LCP dispersed phase and dispersion state in the melt mixing stage of the fluoropolymer and the LCP and improves the interfacial adhesion between the fluoropolymer and the fibrous LCP U.S. Patent Application Publication 2001/0006727). However, these fluoropolymer-liquid crystal polymer blends have failed to provide reliable electronic materials and products because during melt extrusion, the LCP molecules extensively orient in the direction of extrusion (machine direction). As a result, the resulting films are highly anisotropic, exhibiting differences in tensile strength and coefficient of linear expansion between the machine direction (MD, the direction in which the LCP fibers are oriented) and the transverse direction (TD, the direction perpendicular to the direction in which the LCP fibers are oriented. In extruded film or sheet, TD is the width of the extrudate).

These shortcomings have prompted a proposal for a process comprising laminating porous fluoropolymer films to both sides of a previously-extruded LCP film, stretching the laminate biaxially under temperature conditions where the porous fluoropolymer is not melted, but where the LCP is melted, thereby reducing or eliminating the anisotropy so as to be able to use the LCP as a circuit substrate material (Kokai H10-34742). This approach is alleged to cause the LCP molecules to be randomly orientated in the plane of the laminate, thereby reducing or eliminating anisotropy in the physical properties. However, unlike conventional thermoplastic polymers, LCPs have rigid molecular chains which tend to slip past one another with essentially no entanglement between individual molecular chains, making it comparatively difficult to stretch them at temperatures below their melting points. At temperatures at or above their melting points, the viscosities of LCPs drop precipitously; and they flow like liquid thereby losing all fibrillar orientation. Therefore, fibrous LCP is very difficult to orient completely randomly, even when the LCP is laminated between porous fluoropolymer films and biaxially stretched.

There is a need for circuit board material that is free from prior art defects.

SUMMARY OF THE INVENTION

It is an object of this invention to provide a melt processible fluoropolymer laminate which exhibits high mechanical strength, a low coefficient of linear expansion and low thermal shrinkage by having a liquid crystalline polymer (LCP) present in the fibrous state in the fluoropolymer matrix, while retaining the excellent heat resistance, low moisture absorption, and high dielectric characteristics of the fluoropolymer and LCP, and which is suitable for circuit boards by virtue of elimination of anisotropy in these physical properties. It is another object of this invention to provide a melt processible fluoropolymer laminate suitable for circuit boards which enables copper foil to be laminated without use of adhesives by using a compatibilizing agent along with the LCP.

One of the preferred embodiments is a fluoropolymer laminate comprising at least two fluoropolymer sheet layers, each having an LCP oriented in the fibrous state in the melt processible fluoropolymer, wherein said at least two layers have their respective fibrous LCP oriented in different directions from each other. This lamination of the two sheets with different orientation directions of the fibrous LCP contained in each sheet balances the orientation effects of the fibrous LCP in the different directions of orientation. When the different directions of orientation are perpendicular to one another, the laminate is isotropic in these perpendicular directions. If anisotropy is acceptable, then the laminate can comprise as little as one sheet layer of the melt processible fluoropolymer containing the LCP oriented in the fibrous state, such laminate including copper cladding adhered to at least one side of the sheet layer.

A further preferred embodiment includes a fluoropolymer laminate comprising melt processible fluoropolymer layers wherein the fluoropolymer sheet layer having an LCP oriented in the fibrous state in the melt processible fluoropolymer is a fibrous sheet layer selected from the group consisting of woven fabric, non-woven fabric, and knitted fabric of melt processible fluoropolymer fibers containing the LCP oriented in the fibrous state in the fiber direction. To this fibrous sheet, a melt processible fluoropolymer sheet containing no fibrous LCP can be laminated to at least one side of said fibrous sheet.

The expression "oriented in the fibrous state" and the like means that the LCP is in the form of discontinuous fibers dispersed in the fluoropolymer matrix, whether the matrix is in the form of a film forming the sheet or in the form of filaments from which the fibrous sheet embodiment is made. The orientation of these fibers means that they are aligned in one direction. In the case when the sheet is an extruded film of the fluoropolymer, the alignment is in the direction of extrusion. In the case when the sheet is a fibrous sheet, the alignment is in the direction of melt spinning of the filaments from which the sheet is made. Since the filaments, including yarns made therefrom, generally run in perpendicular directions, the fibrous sheet embodiment will be balanced (isotropic) in these directions. Consequently, as little as a single fibrous sheet can be used to form an isotropic reinforcing substrate for copper cladding.

It is preferred for fluoropolymer sheet layer having an LCP oriented in the fibrous state in the foregoing melt processible fluoropolymer to have the LCP formulated therein at a rate of about 3-30% by weight thereof, preferably about 3-25 wt %.

A further preferred embodiment of the invention includes a fluoropolymer laminate wherein the fluoropolymer sheet layer in which an LCP is oriented in the fibrous state in the melt processible fluoropolymer is laminated to at least one side of a polymer layer with a coefficient of linear expansion of about $6 \times 10^{-5}/^\circ$ C. or less. This embodiment provides a preparative advantage in that even when two sides of the melt processible fluoropolymer layers have fibrous LCPs whose orientation directions are the same, no substantial anisotropy expansion is seen, thereby making it unnecessary to consider the orientation direction.

Preferred from among the foregoing fluoropolymer laminates of the present invention is one having a thermal shrinkage at after exposure to 250° C. of not more than about 1.5% and a dielectric constant at the frequency 1 GHz of not more than about 3.0.

The present invention also provides a process for the manufacture of a fluoropolymer laminate, which process comprises melt mixing a melt processible fluoropolymer with an LCP having a melting point of at least about 10° C. higher, preferably least about 15° C. higher than that of said melt processible fluoropolymer; extruding the resultant melt mixture in the form of a sheet in which the LCP is oriented in the fibrous state in the melt processible fluoropolymer in the direction of said extruding; overlapping multiple sheets obtained from said extruding in such a way at least two of said sheets have their respective LCP oriented in the fibrous state oriented in different directions; and laminating said multiple sheets together. This lamination usually involves subjecting the assemblage of overlaid sheets to heat and pressure that bonds them to one another.

The present invention further provides a process for the manufacture of a fluoropolymer laminate, which process comprises overlaying a melt processible fluoropolymer sheet containing no fibrous LCP on at least one side of a fibrous sheet selected from a woven fabric, a non-woven fabric, or a knitted fabric of fluoropolymer fibers having an LCP oriented in the fibrous state in the melt processible fluoropolymer in the fiber direction; and laminating them together. As above, heat and pressure can be used to achieve this lamination.

The present invention further provides a process for the manufacture of a fluoropolymer laminate, which process comprises melt mixing a melt processible fluoropolymer with an LCP having a melting point of at least about 15° C. higher than that of said melt processible fluoropolymer; extruding the resultant melt mixture in the form of a sheet in which the LCP is oriented in the fibrous state in the melt processible fluoropolymer; overlaying at least one sheet obtained from said extruding on at least one side of an isotropic polymer sheet with a coefficient of linear expansion of about $6 \times 10^{-5}/^\circ$ C. or less; and laminating said fluoropolymer sheet and said polymer sheet together, such as by using heat and pressure as described above.

DETAILED DESCRIPTION

Figure 1:
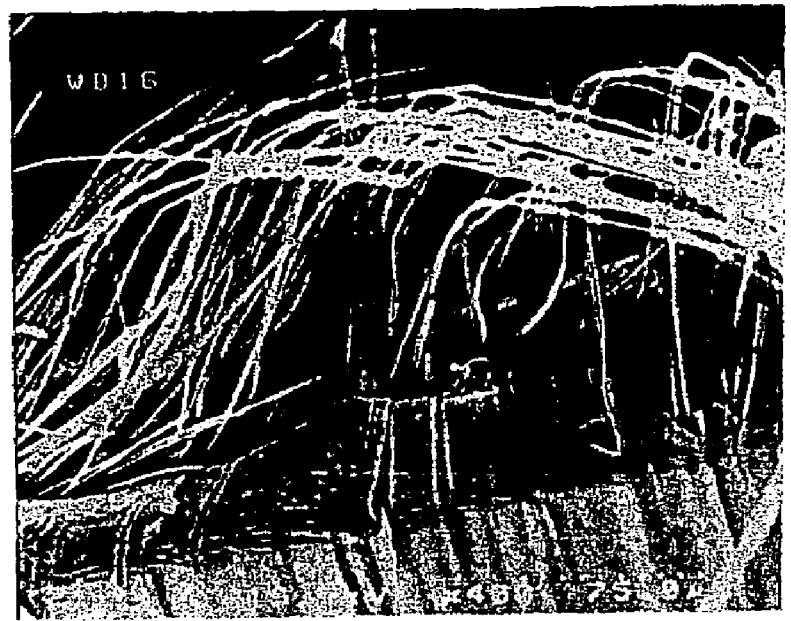
FIG. 1 is a micrograph of the cleaved surface of a melt processible fluoropolymer sheet obtained in Example B.

In this invention, conventional molding grade melt processible fluoropolymer may be used as the melt processible fluoropolymer component, but it is preferred to use melt processible fluoropolymer having functional groups or a blend thereof with a conventional melt processible fluoropolymer.

Melt processible fluoropolymers in general use for molding are known in the art, such as melt processible homopolymers and copolymers (copolymers being defined as polymers containing repeat units derived from two or more monomers) of perfluoroolefin, fluoroolefin, fluorochloroolefin, fluoroolefin containing an ether group or a copolymer of one or more of these with ethylene. Examples of such monomers are tetrafluoroethylene, chlorotrifluoroethylene, hexafluoropropylene, perfluoro(alkyl vinyl ether), vinylidene fluoride, and vinyl fluoride.

Examples of such polymers are copolymer of tetrafluoroethylene with one or more perfluoro(alkyl vinyl ethers) (hereafter PFA), tetrafluoroethylene/hexafluoropropylene copolymer (FEP), tetrafluoroethylene/hexafluoropropylene/ perfluoro(alky l vinyl ether) copolymer (EPE), tetrafluoroethylene/ethylene copolymer (ETFE), polyvinylidene fluoride (PVDF), polychlorotrifluoroethylene (PCTFE), and chlorotrifluoroethylene/ethylene copolymer (ECTFE).

As for the melt processible fluoropolymers containing functional groups (also called functional group-containing fluoropolymers,) the functional groups include carboxyl and its derivatives, hydroxyl, nitrile, cyanato, carbamoyloxy, phosphonoxy, halophosphonoxy, sulfonic acid, or its derivative, and sulfohalides. Such functional group-containing fluoropolymers act as compatibilizing agents, and are normally blended with a conventional melt processible fluoropolymer such as described above at concentrations that do not significantly affect the conventional polymer's properties adversely. The functional group-containing fluoropolymers are prepared, for example, by synthesizing a melt processible fluoropolymer such as described above and then grafting these functional groups on to the polymer. Alternatively, functional groups may be incorporated by including in the copolymerization a monomer having functional groups.

Specific examples of functional groups include —COOH, —CH$_2$COOH, —COOCH$_3$, —CONH$_2$, —OH, —CH$_2$OH, —CN, —CH$_2$O(CO)NH$_2$, —CH$_2$OCN, —CH$_2$OP(O)(OH)$_2$, —CH$_2$OP(O)Cl$_2$, and —SO$_2$F. These functional groups are preferably introduced into the fluoropolymer by copolymerization.

Fluorine-containing monomers suitable for copolymerization and having such functional groups include, for example, fluorinated vinyl ether compounds represented by the formulas: CF$_2$=CF[OCF$_2$CF(CF$_3$)]$_m$—O—(CF$_2$)$_n$—X (where m is 0-3; n is 0-4, X is —COOH, —CH$_2$COOH, —COOCH$_3$, —CH$_2$OH, —CN, —CH$_2$O(CO)NH$_2$, —CH$_2$OCN, —CH$_2$OP(O)OH)$_2$, —CH$_2$OP(O)Cl$_2$, and —SO$_2$F. Most preferred are such functional group-containing fluorinated vinyl ethers such as those represented by the formula CF$_2$=CF—O—CF$_2$CF$_2$—SO$_2$F, or CF$_2$=CF[OCF$_2$CF(CF$_3$)]O(CF$_2$)$_2$—Y, where Y represents —SO$_2$F, —CN, —COOH, —COOCH$_3$ among others) or those represented by the formula CF$_2$=CF[OCF$_2$CF(CF$_3$)] O(CF$_2$)$_2$—CH$_2$-Z (where Z represents —COOH, —OH, —OCN, —OP(O)OH)$_2$, —OP(O)Cl$_2$, and —O(CO)NH$_2$.

The grafting of functional groups onto fluoropolymers and the above described fluorine-containing monomers are described further in the patent literature.

These functional group-containing monomers should be present in the functional group-containing fluoropolymers at concentrations of about 0.5-10% by weight, preferably about 1-5% by weight, based on the total weight of the fluoropolymer. If the functional group-containing monomer content is too small in the functional group-containing fluoropolymer, the polymer's effect as a compatibilizing agent will be small; having too great a content may result in strong interpolymer interactions among the functional groups, resulting in an abrupt increase in viscosity to the extent that melt processing becomes difficult. Furthermore, as the functional group-containing monomer content increases, the functional group-containing fluoropolymer will begin to have inferior heat resistance.

The functional group-containing fluoropolymers are not particularly limited as to viscosity or molecular weight, but they should be melt processible and, if blended with conventional melt processible fluoropolymer, be similar in viscosity to the conventional melt processible fluoropolymer. Melt flow rate (MFR) should range from no less than about 0.5, preferably about 1, more preferably about 2, most preferably about 5, to no more than about 100, preferably about 50, more preferably about 30, most preferably about 25. MFR is measured in g/10 min of molten polymer flowing through an orifice in accordance with the procedure and equipment disclosed in ASTM 1238-94a and the ASTM procedure applicable to particular fluoropolymers, e.g. ASTM D 2116-91 a, ASTM D 3159-91a, ASTM D 3222-99, and ASTM D 3307-93.

The liquid crystalline polymer (LCP) used in this invention is a thermoplastic resin which exhibits thermotropic liquid crystals, with no particular limitation as to the melting point as long as there is no problem in heat resistance at the melt processing temperature. However, in terms of processability and heat stability, it is preferred to use an LCP having a melting point at least about 15° C. higher than that of the melt processible fluoropolymer. Such LCPs include polyesters, polyester amides, polyester imides, and polyester urethanes; polyesters being preferred. Typical liquid crystalline polyesters are all-aromatic polyesters. Many are known. They are derived from aromatic dicarboxylic acids and aromatic dihydroxy compounds or from aromatic hydroxy carboxylic acids, and may include polymerization units derived from an aliphatic dicarboxylic acid, an aliphatic dihydroxy compound, an aliphatic hydroxy carboxylic acid. In addition there are those having polymerizable units derived from aromatic dicarboxylic acids such as terephthalic acid, isophthalic acid, 2,6-naphthalene dicarboxylic acid, and aromatic dihydroxy compounds such as hydroquinone, resorcinol, 2,6-dihydroxy naphthalene, bisphenol A, dihydroxy diphenyl, and aromatic hydroxy carboxylic acids such as para-hydroxy benzoic acid. LCP that can be used in the present invention are further described in the patent literature.

One of the methods for manufacture of a fluoropolymer sheet containing fibrous LCP is to melt blend melt processible fluoropolymer with LCP, preferably along with said functional-group containing fluoropolymer and to extrude this blend into sheet form or as filaments under suitable conditions. The amount of functional group-containing fluoropolymer (compatibilizing agent) will depend on the type and amount of the functional group used, but should be about 0.5-30% by weight, preferably about 1-15% by weight of the above polymer material. Weight percents are based on the total weight of the blend of fluoropolymer, including compatibilizer and LCP. The greater the amount of the compatibilizing agent in the blend, the lower will be the surface tension between the fluoropolymer and the LCP. Thereby, the interfacial adhesion will be greater. However, compounding too much functional group-containing fluoropolymer may result in strong interpolymer interaction among the functional groups resulting in an abrupt increase in the viscosity, sometimes making it difficult to melt process. In addition, an excessively high functional group-containing fluoropolymer content will result in reduced heat resistance of the fluoropolymer sheet.

The term "sheet" in this invention means broadly any article in which two of the dimensions (length and width) are significantly greater than the third (thickness) such as films, woven fabrics, non-woven fabrics, and knitted fabrics.

The amount of LCP blended in the fluoropolymer should be about 3-30% by weight, preferably about 3-25% by weight, and more preferably, about 4-25 wt %, based on the total weight of the blend Too little LCP will not afford a sufficiently high reinforcing effect. Too much LCP in the blend will risk having at least some of the LCP form large pockets in the fluoropolymer matrix causing sudden local decreases in viscosity during sheet extrusion steps, adversely affecting the uniformity the sheet or filament thickness. The LCP should not form the continuous phase, with the fluoropolymer dispersed therein.

The above functional group-containing fluoropolymer (compatibilizing agent) and the LCP each provide improved adhesion to metals such as copper, so that adjustment of the amount of each added can provide a laminate suitable for electrical and electronic parts applications.

The mixing of the melt processable fluoropolymer and functional-group containing fluoropolymer with a LCP to provide the starting material for the above fluoropolymer sheet can be done by any conventional melt mixing method, but it is preferred to use an extruder, preferably one with a high shear rate, because high shear will better disperse the LCP, that is, distribute it in smaller particles throughout the fluoropolymer matrix. It is further preferred to use a twin screw extruder rather than a single screw extruder. The LCP particle size after melt mixing and before the sheet extrusion should be not greater than about 30 µm, preferably, about 1-10 µm. In addition, in order to obtain a uniformly sized LCP fibers in the fluoropolymer matrix in the sheet formation step, use of a T-die or annular die for extrusion after melt mixing is preferred.

The aforementioned melt processable fluoropolymer and the LCP, preferably with a functional group-containing fluoropolymer in the mixture (hereafter, the mixture may be called "fluoropolymer blend") are used to prepare fluoropolymer sheet in which the LCP is in a fibrous state, the fibers being oriented in the machine direction, that is, the direction of the extrusion. This is achieved by extruding the fluoropolymer mixture into sheet form using a T-die or annular die. During this extrusion, the LCP particles dispersed in the fluoropolymer matrix are deformed into a fibrous form. In order to uniformly turn them into fibers in the fluoropolymer matrix from the LCP dispersed phase in the sheet extruding steps, the extrusion temperature should preferably be at least about the melting point of the LCP used therein and preferably no more than about 20° C. greater that the melting temperature of the LCP.

The diameters of the LCP fibers in the fluoropolymer matrix in the melt processable fluoropolymer sheet extruded by a T-die or the like can be controlled by the size of the particles or droplets of the LCP dispersed in the melt mixture before sheet extrusion and by the draw ratio in the melt extrusion step (die lip clearance/thickness of the film or sheet produced). The smaller the size of the droplets of dispersed LCP in the molten mixture before sheet extrusion, and the greater the draw ratio, the smaller the diameter of the LCP fibers. The draw ratio should be at least about 5, preferably in the range of about 10-200.

The extruded sheet thickness is about 10-1000 µm, preferably about 20-400 µm. At least 50 wt %, preferably 70 wt %, more preferably 90 wt % of the LCP fiber should have a diameter of not more than about 30 µm, preferably in the range of about 1-10 µm and have an aspect ratio of at least about 10, preferably at least about 20. The aspect ratio is defined as the length of the fiber divided by the diameter of the fiber or if the fiber is not circular in cross section, its maximum cross-sectional dimension. When extruded sheet thickness is less than about 60 µm, the LCP fiber, rather than being round in cross section, tends to assume a ribbon-like cross section, i.e. an approximately rectangular cross section. In this case, the dimensions disclosed above should be understood to refer to the greater dimension of the fiber cross section, the longer side of the approximately rectangular cross section.

The fluoropolymer laminates of this invention can be formed by using an extruded sheet of the type described above in at least one layer thereof. That is, the laminate may be comprised of one or two or more layers of said extruded sheets and one or two or more layers of melt processable fluoropolymer sheets not containing fibrous LCP, or from multiple extruded sheets of the melt processable fluoropolymer containing fibrous LCP. Further they may be constituted from one or two or more sheets of said extruded sheets and one or two or more sheets of polymer layers other than melt processable fluoropolymer and having coefficients of linear expansion of about $6 \times 10^{-5}/°$ C. or less.

Manufacture of the laminates of this invention from a plurality of the above extruded sheets is done by overlaying the multiple sheets and bonding them with heat and pressure. Since the above-extruded sheet has the LCP fibers oriented mostly in the direction of draw (MD or machine direction) there is substantial anisotropy in physical properties between the MD and TD (transverse direction). To reduce or eliminated anisotropy in physical properties of the laminate, two extruded sheets are overlaid in such a way that the orientation directions of the fibers of LCP are at approximately right angles (a two-layer lamination). With three or more layers (multilayer lamination), the layers are overlaid at different angles so as to obtain as far as possible the same properties in all directions. The optimal arrangement for a laminate of N layers can be approximated by overlaying each layer after the first so that its MD is +180°/N offset from the layer below it. However, for minimum waste and to reduce the need to trim the laminate, it is often better to overlay the layers at right angles, preferably alternating with each layer. A even number of layers are preferred to give a more isotropic laminate.

Lamination may be done with heated rolls or presses providing both the heat and pressure to achieve the bonding of the sheets together, on a plurality of the above-extruded sheets. Thickness of the laminate is controlled by adjusting roll or press clearance and/or pressure.

The lamination temperature should be at least equal to the melting temperature of the fluoropolymer, but below the melting point of the LCP. If the lamination temperature is higher than the melting point of the LCP, the oriented LCP fibers in the extruded sheet will melt and will lose fibrous structure, which is not desirable. If the lamination temperature is below the melting point of the fluoropolymer it will be difficult to obtain good adhesion between the extruded sheets. Therefore, the lamination temperature should be at least about 2-30° C. higher than the melting point of the fluoropolymer and in the range of at least about 10° C. lower than the melting point of the liquid crystalline polymer. According to this invention, laminates may be two layer or multilayer in which extruded sheets are sequentially overlaid with the orientation of the LCP fibers unlimitedly arranged as desired. However, for low shrinkage, multilayer, i.e. greater than two layer, laminates are preferred. In the multilayer laminate, it is preferred that the extruded sheets be overlaid so as to result in a laminate that is as nearly as possible isotropic in regards to physical properties. The laminate may include one or more melt processable fluoropolymer sheets containing no LCP and these may be the top and/or bottom layer of the laminate. The sequencing of the extruded sheet and melt processable fluoropolymer sheet may be freely varied. Although it will depend upon the application, the laminate thickness may be about 20-2000 µm thick, preferably about 50-1000 µm thick.

The laminate will have the fibrous LCP oriented in a single direction in each component extruded sheet, but adjusted in such a way that the physical properties are balanced, that is as uniform as possible in all directions. Therefore, the melt processable fluoropolymer laminates of this invention can provide low coefficient of linear expansion, low thermal shrinkage, and at the same time a high tensile modulus that could not be achieved with conventional fluoropolymer sheets. Since fluoropolymer has a dielectric constant lower than the liquid crystalline polymer, the laminate will exhibit a lower dielectric constant than would a pure LCP sheet (as disclosed for example, in Kokai H10-34742).

The fluoropolymer laminates resulting from lamination of the above-extruded sheets may have LCP fibers in areas close to the sheet surface and streaks may sometimes appear in the sheet in the MD, resulting in thickness non-uniformity. Streaks or thickness irregularities in the fluoropolymer sheet will make it more difficult to use as a circuit board material. In order to prevent surface defects caused by such streaks and thickness non-uniformities, temperature and pressure may be controlled during lamination, or one may overlay a melt processable fluoropolymer sheet or a functional group-containing fluoropolymer sheet on one side or both sides of the fluoropolymer laminates, followed by lamination. The melt processable fluoropolymer sheets or functional group-containing fluoropolymer sheet for such objectives may be, for example, about 10-500 µm thick.

Furthermore, for improving the peel strength between the fluoropolymer laminate of this invention prepared by lamination of the above type extruded sheets and copper foil, one may overlay a functional-group-containing fluoropolymer sheet or a blend of an LCP and a functional-group-containing fluoropolymer sheet on one or both sides of the fluoropolymer laminate and laminating. The functional-group-containing fluoropolymer sheet or a blend of an LCP and a functional-group-containing fluoropolymer sheet used for the purpose should be not more than about 200 µm, preferably not more than about 100 µm thick.

As described above, the fluoropolymer laminate of this invention may be comprised of one or two or more extruded sheets of a melt processable fluoropolymer containing fibrous LCP and one or two or more sheets of polymer layers other than melt processable fluoropolymers and having coefficients of linear expansion of about $6 \times 10^{-5}/°C$. or less, such polymer sheets thereby being isotropic. Use of these isotropic sheets such as biaxially stretched sheets having this low coefficient of linear expansion in both (perpendicular) directions as the polymer layers is advantageous in that this will facilitate formation of a substantially isotropic fluoropolymer laminate with a minimal effect of the orientation directions of the fibrous LCP that constitute the above extruded sheets. The temperature of the lamination should be below the melting point of the isotropic LCP sheet so as to avoid melting the LCP and changing the properties of the LCP sheet.

The polymers used above should have coefficients of linear expansion of about $6 \times 10^{-5}/°C$. or less, preferably about $5 \times 10^{-5}/°C$. or less, more preferably about $3 \times 10^{-5}/°C$. or less. Such polymers include, for example, LCPs mentioned above as fibrous LCP materials, polysulfone, amorphous polyarylate, polyphenylene sulfide, polyether sulfone, polyetherimide, polyamideimide, polyetheretherketone, and polyimide. When this type of polymer sheet is used, it is preferred that it be sandwiched between two layers of the fibrous LCP-containing melt processable fluoropolymer layers. In this case the polymer sheet layer thickness, although dependent on the application, may be, for example, about 10-2000 µm, preferably about 20-400 µm, with the overall laminate being for example about 20-2000 µm, preferably about 50-1000 µm thick. In such cases, use of the above type extruded sheet or a functional-group-containing type fluoropolymer as a melt processable fluoropolymer can enhance the adhesion to copper foil.

Another method for obtaining the fluoropolymer laminate according to this invention includes, instead of using the above extruded sheets containing fibrous LCP, using a fabric made from fiber of a melt processable fluoropolymer containing a fibrous LCP by methods such as weaving or knitting, or by techniques for making nonwoven fabrics. In order to prepare a melt processable fluoropolymer fiber containing LCP oriented in the fibrous state, one may use materials similar to those cited above for extruded sheet, extruding under similar conditions but through dies, also known as spinnerets, suitable for fiber formation. For the details of such a process, see disclosures in Kokai 2001-88162 (EP 1 086 987 A1) and 2001-181463 (U.S. Patent Application Publication 2001/0006727). It is preferred that the fiber diameter to be about 5-1000 µm, and that the LCP fibers have a diameter of not more than 30 µm, preferably about 1-10 µm with an aspect ratio being preferably at least about 40, preferably at least about 80. The fiber sheet should particularly have a thickness of about 10-1000 µm, particularly about 30-500 µm.

The fibrous LCP in the melt processable fluoropolymer fiber is oriented in the lengthwise direction or MD, i.e. along the fiber axis. The fibrous sheet resulting from converting the melt processable fluoropolymer fiber to non-woven fabric, woven fabric, knitted fabric, or the like, has generally isotropic physical properties. Therefore, by laminating melt processable fluoropolymer sheet or functional group-containing fluoropolymer sheet to one side or both sides of such a fiber sheet, one can obtain a preferred fluoropolymer laminate of this invention. In such a case, the laminate, like a laminate from extruded sheet, may be made about 2-2000 µm, preferably about 50-1000 µm thick. For the manufacture of fibrous sheets such as woven fabric, non-woven fabric, knitted fabric, or the like, from a melt processable fluoropolymer fiber containing a fibrous LCP, known technologies can be used that are employed for generating fibrous sheets from common fibers. Examples of such technologies are weaving and knitting.

Any desired layer of the fluoropolymer laminated layers of this invention may be optionally formulated with additives. Such additives include, for example, antioxidants, light stabilizers, antistatic agents, fluorescent whiteners, colorants, metal oxides such as silica, alumina, and titanium oxide; metal carbonates such as calcium carbonate and barium carbonate; metal sulfates such as calcium sulfate, and barium sulfate; silicate salts such as talc, clay, mica, and glass; as well as inorganic fillers such as potassium titanate, calcium titanate, and glass fibers; and organic fillers such as carbon black, graphite, and carbon fibers.

This invention provides fluoropolymer laminates of have a thermal shrinkage of not more than 1.5%, preferably not more than 1.2% at 250° C. and a dielectric constant at the frequency 1 GHz of not more than about 3.0, preferably in a range of about 2.1-2.9, more preferably in a range of about 2.1-2.6.

The difference in the thermal shrinkage at 250° C. between the machine and transverse directions should not be more than about 10%, preferably not be more than about 5%, more preferably about 0%.

EXAMPLES

LCP is Liquid Crystalline Polymer
Laminate properties are determined as follows:

(1) Thermal Shrinkage

Samples, 100 mm×10 mm, sample are cut out from the sheet or laminate in both the MD and TD, and the length in the longer dimension is measured using an optical microscope. Then, the samples are put into a constant temperature circulating-air oven at 250° C. for 30 minutes, then cooled to room temperature, and remeasured. The thermal shrinkage for each sample is determined using the equation below. The determination calls for measuring three samples and averaging the results to give the reported value.

Thermal shrinkage=((length before heating−length after heating)/length before heating)×100.

(2) Dielectric Constant

Dielectric constant is measured using the three-plate circuit resonance method. This method is described in "Polymers For High Frequency Applications", Chap 5.4.4, CMC Press, Tokyo, 1999. The frequency is 1 GHz.

(3) Tensile Modulus

Tensile Modulus is measured according to ASTM D882 at a rate of separation of 50 mm/min.

(4) Peel Strength

A PFA laminate is laminated to a 0.1 mm thick copper foil using a hot plate press (temperature 325° C., pressure 3 MPa for 15 minutes to obtain a 1 cm wide peel test sample, which test piece is then tested according to IPC-TM-650 2.4.8, using the 180° peel test at the rate of 50 mm/min. Peel strength (kg/cm) is measured. The IPC Test Manual 650 is available from IPC—Association Connecting Electronics Industries, 2215 Sanders Rd., Northbrook Ill. 60062-6135, USA.

(5) Coefficient of Linear Expansion

Coefficient of linear expansion is measured with a Seiko Instruments Inc. TMA SS120. Temperature range is 25°-250° C.; scan rate 5° C./min; Load 50 mN. Sample size 10 mm by 3 mm.

Example A

PFA (manufactured by Mitsui-DuPont Fluorochemicals Co., "PFA 340"; melting point 308° C., melt flow rate (372° C., 5000 g weight), 14 g/10 min) and LCP (manufactured by DuPont Company, Zenite®, 7000, melting point 350° C.) are thoroughly dried and then melt blended at 365° C. in a twin screw extruder, along with a terpolymer of tetrafluoroethylene, perfluoro(propyl vinyl ether) (PPVE), and $CF_2=CF[OCF_2CF(CF_3)]OCF_2CF_2CH_2OH$, (PPVE content 3.7% by weight, 1.1% by weight of the hydroxy-containing monomer, melt flow rate 15 g/10 min) as compatibilizing agent, (fluoropolymer temperature 365° C.) to obtain a fluoropolymer blend. The LCP content of the blend is 20% by weight and the compatibilizing agent content is 2.5% by weight.

The pelletized fluoropolymer mixture from the above is melted in a 30 mm single screw extruder and extruded using a T-die (lip length 200 mm, lip clearance (die opening) 2 mm, die temperature 365° C.) to generate a 100 μm thick fluoropolymer sheet, S1, which contains fibrous LCP oriented in the direction of extrusion, i.e. the MD.

Examples B and C

Figure 2:
FIG. 2 is a micrograph of the cleaved surface of a melt processible fluoropolymer sheet from Example C. These micrographs are at a magnification of 400×.

Example A is repeated except that the LCP content is 10% by weight (in Example B), and 3% by weight (in Example C) to give fluoropolymer sheet samples, S2 and S3. The resultant fluoropolymer sheets are then cleaved in liquid nitrogen at an angle perpendicular to the direction in which the fibrous LCP oriented, followed by observation under a scanning electron microscope (SEM). The results are shown in FIGS. 1 and 2.

Examples 1-3

Two fluoropolymer sheets of sample S1 from Example A are overlaid, arranging two sheets so as to have the LCP fibers oriented at right angles, followed by lamination on a hot plate (temperature 325° C., pressure 3 MPa), followed by cooling to obtain a 180 μm thick fluoropolymer laminate, which is designated sample S4. This is repeated using samples S2 and S3 to give samples S5 and S6 respectively.

Example 4

A fluoropolymer mixture having the same composition as that of Example C that has been melt blended by a twin screw extruder is spun using a 30 mm twin screw extruder (Length/Diameter: 25) through a spinneret having 6 orifices with the orifice diameter of 2.8 mm at a spinning temperature of 365° C. and taken up by a take-up roller at a rate of 300 m/min to give a monofilament (diameter 80 μm), which is then plain woven at a density of 45 threads/25 mm into a cloth sheet (160 μm thick). A 50 μm thick functional-group containing PFA (the compatibilizer agent used in Example A) sheet is prepared using the same hot plate press used in Example A, followed by overlaying functional group-containing PFA sheets, one on each side of the cloth sheet, followed by lamination in a hot plate press (temperature 325° C., pressure 3 MPa) and cooling to obtain a 230 μm thick laminate of the functional group-containing PFA impregnated into the cloth sheet, designated as sample S7.

Example 5

Two fluoropolymer sheets prepared by the procedure of Example B are overlaid in such a way that the LCP fibers are oriented at right angles. On each side of this pair of sheets is overlaid functional group-containing PFA sheets prepared by the procedure of Example 4 to give the laminate structure: functional group-containing PFA sheet/fluoropolymer sheet/fluoropolymer sheet/functional group-containing PFA sheet. This combination is laminated in a hot plate press (temperature 325° C., pressure 3 MPa), followed by cooling to give a 250 μm thick fluoropolymer laminate, sample S8.

Example 6

A fluoropolymer mixture having the same composition as that of Example B is extruded from a 30 mm single screw extruder fitted with a T-die (lip length 200 mm, lip clearance 2 mm, die temperature 365° C.) to generate a 25 μm thick fluoropolymer sheet containing fibrous LCP. Six pieces of this fluoropolymer sheet are overlaid so that the orientation directions of the fibrous LCP cross are at right angles, laminated using a hotplate press (temperature 325° C., pressure 3 MPa), and allowed to cool, giving a 150 μm thick fluoropolymer laminate designated sample S9.

Example 7

Fluoropolymer sheets, 25 μm thick, prepared by the procedure of Example 6 are overlaid on the top and bottom sides of a 50 μm thick LCP (Zenite® 7000) sheet, which is biaxially stretched in such a way that the orientation directions of the fibrous LCP are as near as possibly the same. This is difficult because of the problem of stretching LCP, which is discussed in the Background of the Invention. The combined sheets are laminated on a hot plate press (temperature 325° C., pressure 3 MPa), and allowed to cool, resulting in a 100 μm thick laminate designated sample S10.

Example 8

A 1 mm thick laminate prepared by laminating the fluoropolymer sheets made by the procedure of Example A is laminated to copper foil using a hot plate press (temperature 325° C., pressure 3 MPa) to obtain a sample for peel testing.

Example 9

A 1 mm thick fluoropolymer laminate obtained by the procedure of Example 6, except for decreasing the amount of the LCP to 10% by weight, and increasing the functional-group containing PFA to 10% by weight, is laminated to copper foil using a hot plate press thereby obtaining a peel test sample.

Example 10

A 1 mm thick laminate prepared by laminating the fluoropolymer sheets prepared by the procedure of Example C is laminated to copper foil using a hot plate press to obtain a peel test sample.

Comparative Example 1

PFA fluoropolymer (PFA 340) is compression molded into sheet using a hot plate press (temperature 350° C., pressure 6 MPa) and cooled to give a 200 μm thick PFA sheet, sample R1.

Comparative Example 2

LCP (Zenite® 7000) is compression molded into sheet form using a hot plate press (temperature 360° C.) and cooled to give a 200 μm thick sheet, sample R2.

Comparative Example 3

A 1 mm thick laminate obtained by laminating PFA (PFA 340) sheets of Comparative Example 1 is laminated to copper foil in a hot plate press to obtain a peel test sample.

The physical properties of the melt processable fluoropolymer sheets and laminates prepared above are measured and the results are summarized in Tables 1 and 2 and FIGS. 1 and 2. Since the samples S1, S2 and S3 have their LCP fibers oriented in one direction with consequential anisotropy in physical properties, their physical properties are measured in both the MD and TD. Since samples S4-S6 and S8-S9 have their liquid crystalline fibers oriented so that the fibers in the top fluoropolymer sheet are at right angles to the fibers in the bottom sheet, and since Sample 10 is a biaxially stretched isotropic LCP sheet, both MD and TD properties are measured, but no difference is found between the two directions. Therefore only the results measured in one direction (thermal shrinkage and tensile modulus) are summarized in Table 1. The results of peel strength testing of these pieces are summarized in Table 2.

TABLE 1

| | Thermal Shrinkage % | | Dielectric | Tensile Modulus (MPa) | | Sample |
|---|---|---|---|---|---|---|
| | MD | TD | Constant | MD | TD | No. |
| Example A | 0.2 | 1.5 | 2.6 | 3500 | 700 | S1 |
| Example B | 0.3 | 3.5 | 2.4 | 2060 | 560 | S2 |
| Example C | 2.0 | 3.8 | 2.2 | 490 | 440 | S3 |
| Example 1 | 0.8 | | 2.5 | 1740 | | S4 |
| Example 2 | 1.1 | | 2.3 | 980 | | S5 |
| Example 3 | 2.1 | | 2.1 | 550 | | S6 |
| Example 4 | 1.4 | | 2.4 | 720 | | S7 |
| Example 5 | 1.3 | | 2.2 | 690 | | S8 |
| Example 6 | 0.6 | | 2.2 | 995 | | S9 |
| Example 7 | 0.5 | | 2.5 | 2500 | | S10 |
| Comp. Ex 1 | 4.1 | | 2.1 | 475 | | R1 |
| Comp. Ex 2 | Not more than 0.1% | | 3.0 | Not measured | | R2 |

TABLE 2

| | Composition (% by weight) | | | Peel Strength (kg/cm) |
|---|---|---|---|---|
| | PFA | Compatibilizing Agent | Liquid Crystalline Polymer | |
| Example 8 | 77.5 | 2.5 | 20 | 2.8 |
| Example 9 | 80 | 10 | 10 | 3.6 |
| Example 10 | 94.5 | 2.5 | 3 | 1.7 |
| Comp. Ex 3 | 100 | 0 | 0 | 0.8 |

Table 1 shows that in the fluoropolymer sheets S1, S2 and S3, obtained by extrusion through a T-die (Examples A-C), improvements are observed in thermal shrinkage and tensile modulus with increasing amount of the liquid crystalline polymer. However, since the LCP is oriented in one direction, there is anisotropy in the physical properties. FIGS. 1 and 2 show that sample S2 (Example B) with a 10% by weight. LCP incorporated has fibrous LCP throughout the sheet cross-section while a sample S3 (Example C) with a 3% by weight of the LCP has the minimum amount of fibrous LCP. Therefore, the blend ratio of the LCP, which depends on the T-die extrusion conditions, is in the range of about 3-25% by weight, preferably about 4-25% by weight. Blending fluoropolymer with LCP increases the dielectric constant somewhat, but even sample S1 (Example A) having a 20% by weight of LCP has a dielectric constant of only 2.6, still suitable for a circuit board material for high frequency use.

Laminate samples (Examples 1-3) obtained by laying two T-die-extruded fluoropolymer sheets one over the other so as to have the LCP fibers oriented at right angles, thereby reducing anisotropy in the physical properties of the fluoropolymer sheet samples, followed by a hot plate press lamination also show improved thermal shrinkage and tensile modulus with an increase in the blend ratio of the liquid crystalline polymer. Essentially no difference in physical properties is observed between the MD and TD. Example 1 shows that it is possible to reduce thermal shrinkage to 1% or less by increasing the amount of the LCP to 20% by weight or higher. A sample obtained by replacing the T-die extruded fluoropolymer sheet with a fluoropolymer cloth sheet (Example 4) shows improved thermal shrinkage and tensile modulus relative to a pure fluoropolymer sheet (Comparative Example 1).

Laminate S8 (Example 5) obtained by overlaying fluoropolymer sheet and functional group-containing PFA sheet in this order: functional group-containing PFA sheet/fluoropolymer sheet/fluoropolymer sheet/functional group-containing PFA sheet has thermal shrinkage and tensile modulus inferior to Example 2 because of the two functional group-containing PFA sheets without LCP component, but it has a superior dielectric characteristics. As shown in FIG. 1, the fluoropolymer sheet having LCP oriented in the fibrous state has the LCP fiber present even in the area close to the sheet surface so that sometimes streaks appear in the sheet MD with thickness non-uniformity. Streaks and thickness non-uniformity in the fluoropolymer sheet would make it difficult to use such a material for circuit board. A laminate as in Example 5 is effective for overcoming the streaked surface state due to such streaks and thickness non-uniformity. Since Example 5 has functional-group-containing PFA sheets on both sides, it is expected to provide improved peel strength to copper foil.

The sample of Example 6 (X/Y/X/Y/X/Y, X=MD, Y=TD) prepared by having six-fluoropolymer sheets, in which the LCP is oriented in the fibrous state, crossed at right angles, in place of the product from a 2-layer lamination (Example 2, X/Y directions), of the same overall composition, involves more cancellation of the orientation directions in the laminate, so that its thermal shrinkage is less than that of Example 2. Therefore, from the standpoint of achieving isotropic physical properties, the fluoropolymer laminate is preferably a multi-layered laminate having 4, 6, 8 layers or more, rather than a 2-layer laminate. S10 (Example 7), the laminate prepared from fluoropolymer sheets in which LCP is oriented in the fibrous state on either side of an LCP sheet prepared by biaxial stretching method exhibits improved thermal shrinkage and tensile modulus by virtue of having the LCP sheet.

Peel strength test results summarized in Table 2 show that PFA sheet bonded to copper foil (Comparative Example 3) has poor peel strength. However, samples in which a compatibilizing agent and LCP are blended show improved peel strength. In particular, Example 7 shows a synergistic effect of the compatibilizing agent and LCP on the peel strength. Though both LCP and compatibilizer beneficially affect adhesion, as stated above, excessive LCP can lead to "pockets" of LCP in the blends with deleterious effects on extrusion and laminate quality. Excessive amounts of compatibilizer can decrease the heat stability of the laminate. Therefore, the amounts LCP and compatibilizer and their ratios should be chosen to balance the beneficial with the deleterious effects of these ingredients.

Example 11

Two 25 μm thick fluoropolymer sheets, each containing LCP oriented in a fibrous state, prepared by the procedure of Example 6 are overlaid on the top and bottom sides of a 50 μm thick sheet of polyimide (Kapton® H manufactured by DuPont-Toray Co. Ltd.) having a coefficient of linear expansion of $2.7 \times 10^{-5}/°$ C. in perpendicular directions. The orientation directions of the sheets are the same direction in the overlaid assemblage. The assemblage is hot pressed at 325° C., which is above the melting point of the fluoropolymer, but less than the melting point of the polyimide, at a pressure of 3 MPa, and allowed to cool, resulting in the bonding of the fluoropolymer sheets to each side of the polyimide sheet to form a laminate thereof 100 μm thick The resultant laminate exhibits a thermal shrinkage of 0.6%, a dielectric constant of 2.9, and a tensile modulus of 1850 MPa.

The present invention provides fluoropolymer laminates having isotropic properties. For example, an embodiment in which multiple fluoropolymer sheets containing fibrous LCP in the melt processable fluoropolymer are laminated, despite having the fibrous LCP oriented in one direction in a single extruded sheet, makes it possible to laminate in such a way as to compensate for their orientation directions, the laminate thereby becoming isotropic as regards physical properties. Therefore, the invention provides fluoropolymer laminate having a low linear coefficient of expansion and low thermal shrinkage that can not be achieved with conventional fluoropolymer sheets, the laminates also having elevated tensile modulus and low dielectric constant.

A fluoropolymer laminate of this invention having such properties is suitable for circuit board material. It is also expected to find applications other than circuit boards such as in insulating sheet materials for transformers and motors, heat resistant sheets, prepreg substrates, and in the packaging material area.

What is claimed is:

1. A laminate comprising an isotropic polymer layer with a coefficient of linear expansion of about $6 \times 10^{-5}/°$ C. or less and laminated to both sides thereof a melt processable fluoropolymer sheet layer in which an LCP is oriented in the fibrous state in the melt processable fluoropolymer, at least part of the melt processable fluoropolymer is a functional-group-containing fluoropolymer.

2. The laminate as set forth in claim 1, further comprising copper cladding adhered to one or both sides of said laminate.

3. The laminate as set forth in claim 1 wherein said isotropic polymer layer has a coefficient of linear expansion of about $3 \times 10^{-5}/°$ C. or less.

4. The laminate as set forth In claim 1 wherein the orientation direction of said LCP In the fibrous state is the same in each said fluoropolymer sheet layers in which LCP is oriented in the fibrous state.

5. The laminate as set forth in claim 1, wherein said laminate has a thermal shrinkage at 250° C. of not more than about 1.5% and a dielectric constant at a frequency of 1 GHz of not more than about 3.0.

6. The laminate as set forth in claim 1, wherein the fluoropolymer sheet layer having an LCP oriented in the fibrous state in the melt processable fluoropolymer contains the LCP in a range of about 3-30% by weight thereof.

7. The laminate as set forth in claim 1 wherein said isotropic polymer layer is isotropic by virtue of having been biaxially stretched.

8. The laminate as set forth in claim 1 wherein said isotropic polymer layer has a thickness of about 20 to 400 micrometers.

9. The laminate as set forth in claim 1 wherein said Isotropic polymer layer is LCP, polysulfone, amorphous polyarylate, polyphenylene sulfide, polyether sulfone, polyetheretherketone, or polyimide.

10. The laminate as set forth in claim 9 wherein said isotropic polymer layer is polyimide.

11. Laminate comprising melt processable fluoropolymer layers wherein two layers thereof are fluoropolymer sheet layers in which an LCP is oriented in the fibrous state in the melt processable fluoropolymer, at least part of the melt processable fluoropolymer in said fibers being a functional-group-containing fluoropolymer and wherein the at least two layers thereof have fibrous LCP whose orientation is in directions different from each other.

* * * * *